(12) United States Patent
Mutnury et al.

(10) Patent No.: US 8,542,494 B2
(45) Date of Patent: Sep. 24, 2013

(54) CIRCUIT BOARD HAVING HOLES TO INCREASE RESONANT FREQUENCY OF VIA STUBS

(75) Inventors: Bhyrav M. Mutnury, Austin, TX (US); Nam H. Pham, Austin, TX (US); Terence Rodrigues, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 12/770,691

(22) Filed: Apr. 29, 2010

(65) Prior Publication Data

US 2011/0267783 A1    Nov. 3, 2011

(51) Int. Cl.
  *H05K 1/00* (2006.01)
  *H05K 1/18* (2006.01)
  *H05K 7/00* (2006.01)

(52) U.S. Cl.
  USPC ........................................... 361/748

(58) Field of Classification Search
  None
  See application file for complete search history.

(56) References Cited

U.S. PATENT DOCUMENTS

| | | | |
|---|---|---|---|
| 5,808,361 A | 9/1998 | Bui | |
| 6,077,767 A | 6/2000 | Hwang et al. | |
| 6,303,464 B1 | 10/2001 | Gaw et al. | |
| 6,369,603 B1 * | 4/2002 | Johnston et al. | 324/754.31 |
| 6,845,492 B1 | 1/2005 | Frank et al. | |
| 7,053,729 B2 * | 5/2006 | Aguirre et al. | 333/33 |
| 7,057,115 B2 | 6/2006 | Clink et al. | |
| 7,091,803 B2 * | 8/2006 | Lee | 333/246 |
| 7,291,790 B2 | 11/2007 | Bachar et al. | |
| 7,297,878 B2 | 11/2007 | Kushitani et al. | |
| 7,375,290 B1 * | 5/2008 | Kwark et al. | 174/262 |
| 7,501,586 B2 * | 3/2009 | Wig et al. | 174/262 |
| 7,615,709 B2 | 11/2009 | Goergen | |
| 2004/0187297 A1 | 9/2004 | Su et al. | |
| 2005/0230813 A1 * | 10/2005 | Nakamura et al. | 257/698 |

(Continued)

OTHER PUBLICATIONS

T.J. Ellis et al., "Integration of tapered slot antennas on MMIC substrates through dielectric micromachining" Proceedings of 1996 Antenna Applications Symposium Conference Date: Sep. 18-20, 1996; (Abstract Only Provided).

(Continued)

*Primary Examiner* — Lisa Lea Edmonds
*Assistant Examiner* — Xanthia C Cunningham
(74) *Attorney, Agent, or Firm* — Thomas E. Tyson

(57) ABSTRACT

A circuit board includes layers, a pair of vias filled with a conductive material and extending through the layers, first and second pairs of conductive signal paths, and holes extending at least partially through the layers and located between the pair of vias. The first pair of conductive paths is connected to the pair of vias within a first layer; the second pair of conductive paths is connected to the pair of vias within a second layer. The pair of vias has a pair of via stubs defined between the second layer and a bottom layer. A differential signal is to be transmitted between the first and second pairs of conductive signal paths via the pair of vias. The holes have a lower dielectric constant than the layers to increase a resonant frequency of the pair of via stubs beyond the frequency of the differential signal.

14 Claims, 3 Drawing Sheets

(56) References Cited

U.S. PATENT DOCUMENTS

| | | | |
|---|---|---|---|
| 2005/0244999 A1 | 11/2005 | Masuyama et al. | |
| 2006/0090933 A1* | 5/2006 | Wig et al. | 174/262 |
| 2006/0185890 A1 | 8/2006 | Robinson | |
| 2006/0255876 A1 | 11/2006 | Kaneko et al. | |
| 2006/0258187 A1 | 11/2006 | Behziz | |
| 2007/0091581 A1* | 4/2007 | Gisin et al. | 361/782 |
| 2007/0103251 A1* | 5/2007 | Fan et al. | 333/33 |
| 2008/0227311 A1* | 9/2008 | Chan et al. | 439/74 |
| 2009/0049414 A1* | 2/2009 | Mutnury et al. | 716/2 |
| 2009/0159326 A1* | 6/2009 | Mellitz | 174/266 |
| 2009/0294168 A1* | 12/2009 | Pai et al. | 174/266 |
| 2010/0073893 A1 | 3/2010 | Mutnury et al. | |

OTHER PUBLICATIONS

"A High-Speed Differential Routing and Signaling Configuration with Impedance Compensation" Disclosed Anonymously; IP.Com Technical Disclosure, IPCOM000077226D, Feb. 25, 2005.

J. Wu et al., "A novel method for switching and tuning of PMB structures," Microwave & Optical Technology Letters, vol. 43, No. 4, Nov. 20, 2004.

International Search Report in corresponding PCT patent application PCT/EP2010/056464, dated Jun. 20, 2011.

Examination report in counterpart UK patent application GB1221450.8, dated Apr. 16, 2013.

Reply to Examination report in counterpart UK patent application GB1221450.8, filed Jun. 11, 2013.

* cited by examiner

CIRCUIT BOARD HAVING HOLES TO INCREASE RESONANT FREQUENCY OF VIA STUBS

FIELD OF THE INVENTION

The invention relates generally to a circuit board having vias filled with conductive material to interconnect different layers of the circuit board. More particularly, the invention relates to such a circuit board having holes with a lower dielectric constant than the layers to increase a resonant frequency of resultant via stubs beyond the frequency of a differential signal transmitted between the different layers.

BACKGROUND OF THE INVENTION

Complex circuit boards can have a number of different layers. Typically the layers include signal layers and power/ground layers, where each power/ground layer is a power layer or a ground layer. The signal layers are generally interleaved with the power/ground layers, so that no two signal layers are immediately adjacent to one another, and so that no two power/ground layers are immediately adjacent to one another. To interconnect two signal layers, vias extending through the layers and filled with a conductive material can be employed. Each such signal layer is electrically connected to the vias so that the two signal layers become electrically interconnected to one another.

SUMMARY OF THE INVENTION

A circuit board of an embodiment of the invention includes a number of layers, including a first layer, a second layer below the first layer, and a bottom layer. The circuit board includes a pair of vias filled with a conductive material and extends through the layers. The pair of vias has a pair of via stubs. The circuit board includes a first pair of conductive signal paths connected to the pair of vias within the first layer, and a second pair of conductive signal paths connected to the pair of vias within the second layer. As such, the pair of via stubs is defined between the second layer and the bottom layer. A differential signal having a frequency is to be transmitted between the first pair of conductive signal paths and the second pair of conductive signal paths via the pair of vias. A number of holes extend at least partially through the layers and located between the pair of vias. The holes have a lower dielectric constant than the layers to increase a resonant frequency of the pair of via stubs beyond the frequency of the differential signal.

A method of an embodiment of the invention includes providing a circuit board having a number of layers, a pair of vias filled with a conductive material and extending through the layers, a first pair of conductive signal paths, and a second pair of conductive signal paths. The layers include a first layer, a second layer below the first layer, and a bottom layer. The first pair of conductive paths is connected to the pair of vias within the first layer and the second pair of conductive paths is connected to the pair of vias within the second layer. The pair of vias has a pair of via stubs defined between the second layer and the bottom layer. A differential signal is to be transmitted between the first pair of conductive signal paths and the second pair of conductive signal paths via the pair of vias. The method includes forming one or more holes at least partially through the holes and located between the pair of vias. The holes have a lower dielectric constant than the layers to increase a resonant frequency of the pair of via stubs beyond the frequency of the differential signal.

An electronic device of an embodiment of the invention includes one or more electrical components, and a circuit board on, to, or within which each electrical component is mounted. The circuit board includes a number of layers, including a first layer, a second layer below the first layer, and a bottom layer. The circuit board includes a pair of vias filled with a conductive material and extending through the layers. The pair of vias having a pair of via stubs. The circuit board includes a first pair of conductive signal paths connected to the pair of vias within the first layer, and a second pair of conductive signal paths connected to the pair of vias within the second layer. As such, the pair of via stubs is defined between the second layer and the bottom layer. A differential signal having a frequency is to be transmitted between the first pair of conductive signal paths and the second pair of conductive signal paths via the pair of vias. The circuit board includes one or more holes extending at least partially through the layers and located between the pair of vias. The holes have a lower dielectric constant than the layers to increase a resonant frequency of the pair of via stubs beyond the frequency of the differential signal.

A circuit board of another embodiment of the invention includes a number of layers, including a first layer, a second layer below the first layer, and a bottom layer. The circuit board includes a pair of vias filled with a conductive material and extending through the layers. The pair of vias has a pair of via stubs. The circuit board includes a first pair of conductive signal paths connected to the pair of vias within the first layer, and a second pair of conductive signal paths connected to the pair of vias within the second layer. As such, the pair of via stubs is defined between the second layer and the bottom layer. A differential signal having a frequency is to be transmitted between the first pair of conductive signal paths and the second pair of conductive signal paths via the pair of vias. The circuit board includes means for increasing a resonant frequency of the pair of via stubs beyond the frequency of the differential signal.

BRIEF DESCRIPTION OF THE SEVERAL VIEWS OF THE DRAWINGS

The drawings referenced herein form a part of the specification. Features shown in the drawing are meant as illustrative of only some exemplary embodiments of the invention, and not of all embodiments of the invention, unless otherwise explicitly indicated, and implications to the contrary are otherwise not to be made.

DETAILED DESCRIPTION

Figure 1:
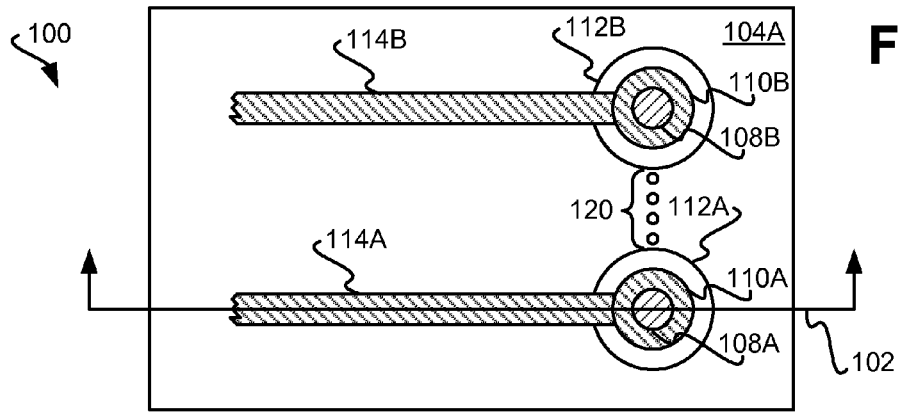
FIG. 1 is a diagram of a top view of a circuit board, according to an embodiment of the present invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As noted in the background section, two signal layers of a multiple-layer circuit board can be interconnected using vias that extend through the layers and that are filled with a conductive material. Each such layer is electrically connected to the vias so that the two signal layers become electrically interconnected to one another. For example, a first signal layer may be the top layer of the circuit board, and a second signal layer may be a layer below the top layer, but above the bottom layer, of the circuit board. Electrically connecting both the first signal layer and the second signal layer to the vias results in these two signal layers becoming electrically interconnected to one another.

A differential signal having a frequency may be transmitted between signal paths on the first signal layer and signal paths on the second signal layer in this example. To ensure high performance, the frequency at which the differential signal is transmitted is relatively high, such as greater than five gigabits-per-second (Gbps). However, a potential problem results from the use of the vias to electrically interconnect the first and the second signal layers.

Specifically, in this example, while the second signal layer is above the bottom layer of the circuit board, the vias extend through all the layers of the circuit board. The portions of the vias between the first signal layer and the second signal layer are actively employed to electrically interconnect the first and the second signal layers together. However, the portions of the vias below the second signal layer—i.e., between the second signal layer and the bottom signal layer—are not. These latter portions of the vias are referred to as via stubs.

The via stubs act as transmission line antennas, and have a resonant frequency. At the resonant frequency of the via stubs, the differential signal transmitted between the signal paths on the first signal layer and the signal paths on the second signal layer are greatly attenuated, such as by three-to-ten decibels or more. For low-frequency differential signals, this issue is not much of a problem, because the differential signals are transmitted at frequencies significantly lower than the resonant frequency of the via stubs. However, for high-frequency differential signals, which are becoming more common as performance specifications are increased, this issue becomes a problem, because the differential signals are transmitted at frequencies near or at the resonant frequency of the via stubs.

A conventional solution to this problem is to back-drill the circuit board at the vias to bore out the via stubs, so that the via stubs are reduced in length if not completely removed. However, back-drilling typically requires expensive and specialized equipment, and further requires that the back-drill be precisely located over the vias. As such, the back-drilling process is expensive and time-consuming.

Embodiments of the invention, by comparison, approach this problem from a different perspective. The resonant frequency of the via stubs is inversely proportional to the dielectric constant of the layers of the circuit board around the vias. Therefore, embodiments of the invention lower the dielectric constant, which serves to increase the resonant frequency of the via stubs. By increasing the resonant frequency of the via stubs beyond the frequency of the differential signal, the attenuating effects of the via stubs are no longer problematic.

Specifically, in one embodiment, a number of holes extending at least partially through the layers of the circuit board are formed, such as by laser-etching. The holes have a lower dielectric constant than the layers of the circuit board. As such, the resonant frequency of the via stubs is increased beyond the frequency of the differential signal. In this way, embodiments of the invention do not remove the via stubs to avoid their deleterious effects as in the prior art, but rather raise the resonant frequency at which these deleterious effects occur so that they are not encountered.

Figure 2:
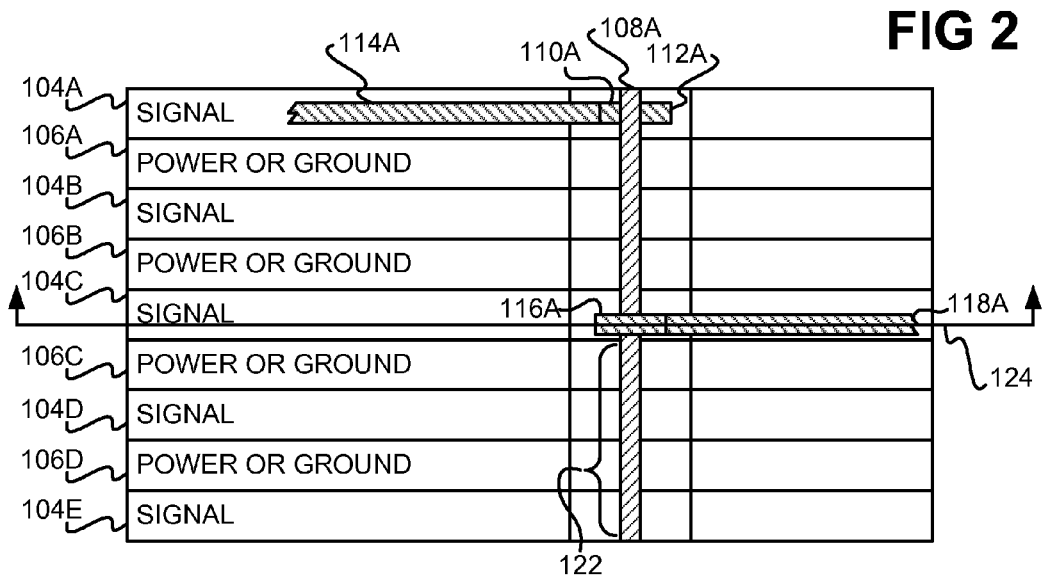
FIG. 2 is a diagram of a cross-sectional front view of the circuit board of FIG. 1, according to an embodiment of the present invention.
Figure 3:
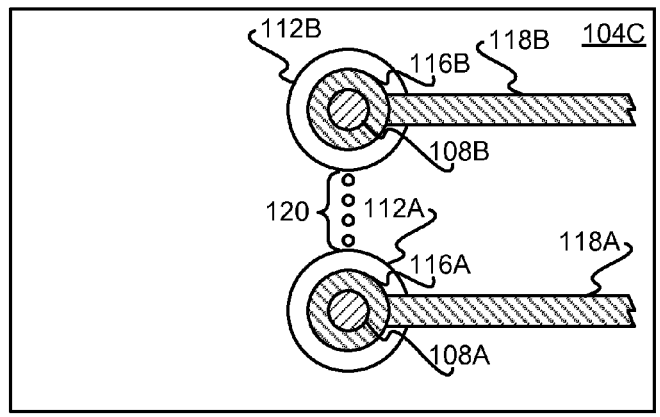
FIG. 3 is a diagram of a cross-sectional top view of the circuit board of FIGS. 1 and 2, according to an embodiment of the present invention.

FIGS. 1, 2, and 3 show a circuit board 100, according to an embodiment of the invention. FIG. 1 is a top view of the circuit board 100, and FIG. 2 is a cross-sectional front view of the circuit board 100 at the sectional mark 102 of FIG. 1. FIG. 3 is a cross-sectional top view of the circuit board 100 at the sectional mark 124 of FIG. 2. The circuit board 100 includes signal layers 104A, 104B, 104C, 104D, and 104E, collectively referred to as the signal layers 104, and power/ground layers 106A, 106B, 106C, and 106D, collectively referred to as the power/ground layers 106. There can be a different number of signal layers 104 than as depicted in FIG. 2, and likewise there can be a different number of power/ground layers 106 than as depicted in FIG. 2.

The signal layers 104 are interleaved in relation to the power/ground layers 106. This means that no two signal layers 104 are immediately adjacent to one another, and that no two power/ground layers 106 are immediately adjacent to one another. Each signal layer 104 may be connected to one or more electrical components mounted within or on the signal layer 104. Each power/ground layer 106 is a ground layer or a power layer. Each ground layer is connected to a relative or absolute ground. Each power layer is connected to the same or different power source.

Vias 108A and 108B, collectively referred to the vias 108, extend completely through the layers 104 and 106 of the circuit board 100. The vias 108 are filled with a conductive material. In the layer 104A, there are pads 110A and 110B, collectively referred to as the pads 110, that are concentric to and in contact with the vias 108. The pads 110 connect conductive signal paths 114A and 114B, collectively referred to as the conductive signal paths 114, to the vias 108. In the layer 104C there are pads 116A and 116B, collectively referred to as the pads 116, that are concentric to and in contact with the vias 108. The pads 116 connect conductive signal paths 118A and 118B, collectively referred to as the conductive signal paths 118, to the vias 108.

Anti-pads 112 concentric to the vias 108 and that surround the pads 110 and 116 extend completely through the layers 104 and 106 of the circuit board 100. The anti-pads 112 are not filled with any material, such that ambient air is located within the anti-pads 112. The anti-pads 112 electrically isolate the vias 108 from the layers 104 and 106 that do not include conductive signal paths, like the conductive signal paths 114 and 118 of the layers 104A and 104C, to connect the layers 104 and 106 in question to the vias 108. Thus, the conductive signal paths 114 and 118 cross the anti-pads 112 to connect to the pads 110 and 116, respectively. Each pad 110 and 116 has a radius smaller than the radius of each anti-pad 112.

The conductive signal paths 114 and the conductive signal paths 118 are therefore connected to the vias 108. A differential signal having a frequency is transmitted between the conductive signal paths 114 of the layer 104A and the conductive signal paths 118 of the layer 104C using the vias 108. As can be seen in FIG. 2 in exemplary relation to the conductive signal paths 114A and 118A and the via 108A, the vias 108 between the layers 104A and 104C are actively used to electrically connect the signal paths 114 within the layer 104A to the signal paths 118 within the layer 104C that is below the layer 104A.

However, the vias 108 extend through all the layers 104. As such, there are portions of the vias 108, extending from the layer 104C to the bottom layer 104E, which are not actively used to electrically connect the signal paths 114 within the layer 104A to the signal paths 118 within the layer 104C. These portions of the vias 108 are referred to as via stubs. There are two via stubs, since each via 108 has a via stub; however, just one via stub 122 is depicted and called out in FIG. 2, which is part of the via 108A. That is, the via stub that is part of the via 108B is not shown in FIG. 2. Nevertheless, the nomenclature "via stubs 122" is used herein to refer to both the visible via stub 122 of the via 108A in FIG. 2, and the via stub of the via 108B that is not visible within FIG. 2.

The via stubs 122 are transmission line antennas that have a resonant frequency. At the resonant frequency of the via stubs 122, the differential signal transmitted between the conductive signal paths 114 and 118 is attenuated. To ensure that the differential signal is not so attenuated, the circuit board 100 includes holes 120 extending at least partially through the layers 104 and 106, and that are located between the vias 108. The holes 120 have a lower dielectric constant than the layers 104 and 106. Because the resonant frequency of the via stubs 122 is inversely proportional to the dielectric constant of the layers 104 and 106 around the vias 108, the presence of the holes 120 increases the resonant frequency of the via stubs 122.

The number and configuration of the holes 120 are specified so that the resonant frequency of the via stubs 122 is raised sufficiently beyond the frequency of the differential signal so that the differential signal is not attenuated. Appropriate modeling and simulation software can be used in this respect to determine the number and configuration of the holes 120. In the example of FIGS. 1 and 3, there are four holes 120 that are positioned along a line between center points of the vias 108.

The holes 120 do not have any purpose within the circuit board 100 other than to decrease the dielectric constant of the layers 104 and 106 around the vias 108, and thus to increase the resonant frequency of the via stubs 122. In one embodiment, the holes 120 extend completely through the layers 104 and 106, but in general, the holes at least partially extend through the layers 104 and 106. In one embodiment, the holes 120 have a radius smaller than the radius of each via 108.

In one embodiment, the holes 120 are not filled with any material, such that ambient air is located within the holes 120. Ambient air has a lower dielectric constant than generally any material from which the layers 104 and 106 can be suitably fabricated. However, in another embodiment, the holes 120 are filled with a material that has a lower dielectric constant than the material from which the layers 104 and 106 are fabricated. In general, the holes serve as the means for performing the functionality of increasing the resonant frequency of the via stubs 122 beyond the frequency of the differential signal.

Figure 4:
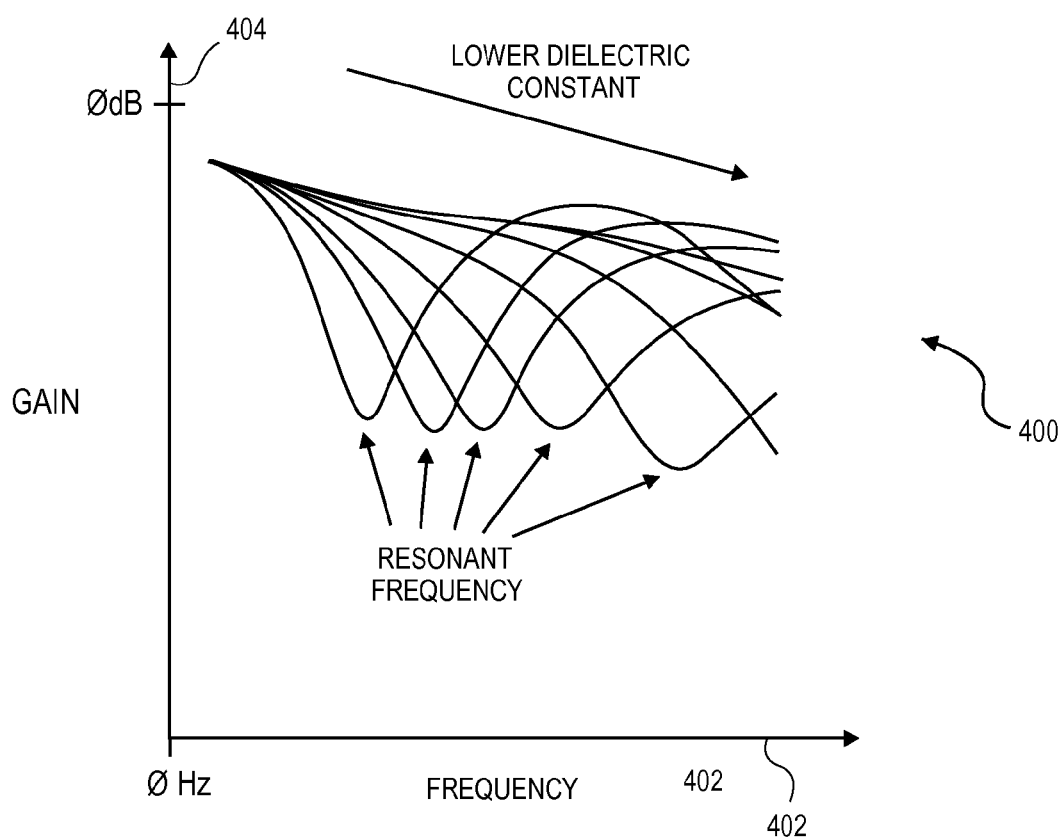
FIG. 4 is a diagram of a graph depicting how lowering the dielectric constant of a circuit board near vias of the board raises the resonant frequency at which signal attenuation is maximized, according to an embodiment of the present invention.

FIG. 4 shows a graph 400 depicting how the lowering the dielectric constant of the circuit board 100 near the vias 108 raises the resonant frequency of the via stubs 122 at which attenuation of the differential signal being transmitted between the conductive signal paths 114 and 118 occurs, according to an embodiment of the invention. The x-axis 402 denotes frequency in hertz (Hz), starts at zero Hz at the left, and increases from left to right. The y-axis 404 denotes gain in decibels (dB), starts at zero decibels at the top, and decreases from top to bottom.

The curves depicted in the graph 400 represent the gain in dB of the differential signal that results from the vias 108. The lowest point of each curve occurs at the resonant frequency of the via stubs 122 of the vias 108. Attenuation of the differential signal is maximized at the resonant frequency of the via stubs, since the gain resulting from the vias 108 is at its lowest at this resonant frequency. As the dielectric constant of the layers 104 and 106 of the circuit board 100 near the vias 108 is decreased, the resonant frequency of the via stubs 122 increases. As such, the resonant frequency of the via stubs 122 can be increased to a frequency beyond the frequency of the differential signal so that attenuation of the differential signal is sufficiently lowered, or minimized, by suitably decreasing the dielectric constant of the circuit board 100 near the vias 108.

Figure 5:
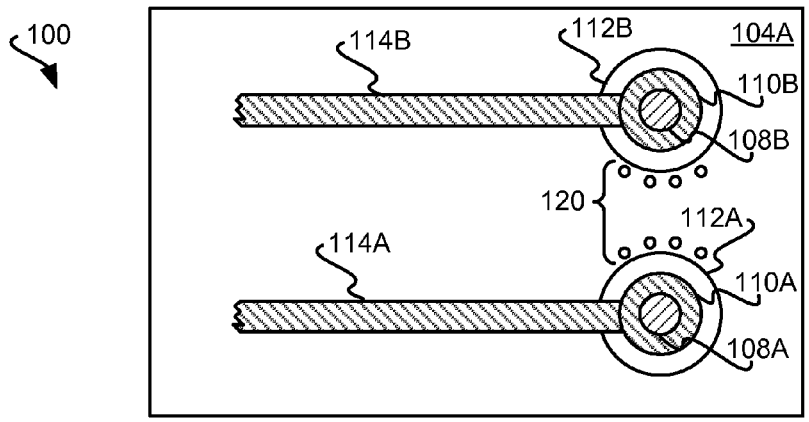
FIG. 5 is a diagram of a top view of a circuit board, according to another embodiment of the present invention.

FIG. 5 shows a top view of the circuit board 100, according to another embodiment of the invention. In FIG. 5, the holes 120 are arranged in a different configuration as compared to the holes 120 in FIGS. 1 and 3. Specifically, some holes 120 are positioned along a curve around the via 108A. Other holes 120 are positioned along a curve around the via 108B. FIG. 5 thus illustrates that the configuration of the holes 120 can be varied to decrease the dielectric constant of the layers 104 and 106 near the vias 108 to raise the resonant frequency of the via stubs 122 beyond the frequency of the differential signal transmitted between the conductive signal paths 114 and 118.

Figure 6:
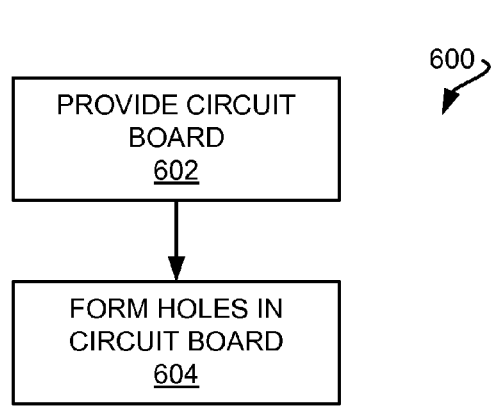
FIG. 6 is a flowchart of a rudimentary method, according to an embodiment of the present invention.

FIG. 6 shows a rudimentary method 600 of manufacture, according to an embodiment of the invention. The circuit board 100 is provided (602). The holes 120 are formed at least partially through the layers 104 and 106 of the circuit board 100 (604). In one embodiment, laser etching may be employed to form the holes 120 within the circuit board 100. As such, back drilling, using expensive and specialized equipment, is unnecessary to form the holes 120, in contradistinction to the prior art's boring out the via stubs 122 by such back drilling. If desired, the holes 120 may subsequently be filled with a material that has a lower dielectric than the material from which the layers 104 and 106 are fabricated. Alternatively, the holes 120 may remain empty, such that atmospheric ambient air is present within the holes 120.

Figure 7:
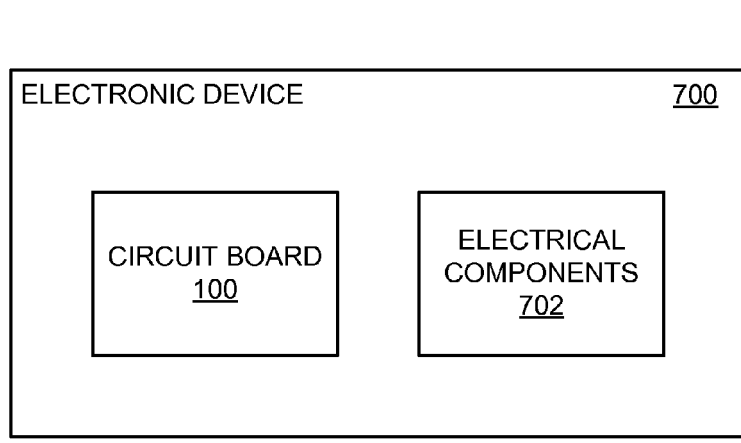
FIG. 7 is a block diagram of a representative electronic device, according to an embodiment of the present invention.

In conclusion, FIG. 7 is a block diagram of a representative electronic device 700, according to an embodiment of the invention. The electronic device 700 includes the circuit board 100 that has been described, as well as one or more electrical components 702. Each electrical component 702 is mounted on, to, or within the circuit board 100. For example, each electrical component 702 may be mounted on, to, or within one of the layers 104 and 106 of the circuit board 100. The electrical components 702 may include resistors, capacitors, inductors, integrated circuits, as well as other types of electrical components. The electrical components 702 are interconnected with one another on the circuit board 100 to work in unison to provide the electronic device 700 with an intended or desired functionality.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A circuit board comprising:
   a plurality of layers including a first layer, a second layer below the first layer, and a bottom layer;
   a pair of vias filled with a conductive material and extending through the layers, the pair of vias having a pair of via stubs;
   a first pair of conductive signal paths connected to the pair of vias within the first layer;
   a second pair of conductive signal paths connected to the pair of vias within the second layer, such that the pair of via stubs is defined between the second layer and the bottom layer, a differential signal having a frequency to be transmitted between the first pair of conductive signal paths and the second pair of conductive signal paths via the pair of vias; and,
   one or more holes extending at least partially through the layers and located between the pair of vias, the holes having a lower dielectric constant than the layers to increase a resonant frequency of the pair of via stubs beyond the frequency of the differential signal.

2. The circuit board of claim 1, wherein the holes extend completely through the layers.

3. The circuit board of claim 1, wherein the holes are not filled with any material, such that ambient air is located within the holes.

4. The circuit board of claim 1, wherein the holes each have a radius smaller than a radius of each via.

5. The circuit board of claim 1, wherein the holes are positioned along a line between center points of the pair of vias.

6. The circuit board of claim 1, wherein the holes comprise:
   a plurality of first holes positioned along a first curve around a first via of the pair of vias; and,
   a plurality of second holes positioned along a second curve around a second via of the pair of vias.

7. The circuit board of claim 1, wherein each via stub is a transmission line antenna having the resonant frequency.

8. The circuit board of claim 1, further comprising:
   a pair of anti-pads concentric to the pair of vias and extending through the layers;
   a first pair of pads on the first layer and concentric to and in contact with the pair of vias, the first pair of pads connecting the first pair of conductive signal paths to the pair of vias, the first pair of conductive signal paths crossing the pair of anti-pads; and,
   a second pair of pads on the second layer and concentric to and in contact with the pair of vias, the second pair of pads connecting the second pair of conductive signal paths to the pair of vias, the first pair of conductive signal paths crossing the pair of anti-pads,
   wherein each pad has a radius smaller than a radius of each anti-pad.

9. The circuit board of claim 1, wherein the plurality of layers comprise a plurality of signal layers and a plurality of power/ground layers, the signal layers interleaved in relation to the power/ground layers such that no two signal layers are immediately adjacent to one another and no two power/ground layers are immediately adjacent to one another,
   wherein the first layer and the second layer are each one of the signal layers,
   and wherein each power/ground layer is one of a ground layer and a power layer.

10. An electronic device comprising:
    one or more electrical components; and,
    a circuit board on, to, or within which each electrical component is mounted,
    wherein the circuit board comprises:
       a plurality of layers including a first layer, a second layer below the first layer, and a bottom layer;
       a pair of vias filled with a conductive material and extending through the layers, the pair of vias having a pair of via stubs;
       a first pair of conductive signal paths connected to the pair of vias within the first layer;
       a second pair of conductive signal paths connected to the pair of vias within the second layer, such that the pair of via stubs is defined between the second layer and the bottom layer, a differential signal having a frequency to be transmitted between the first pair of conductive signal paths and the second pair of conductive signal paths via the pair of vias; and,
       one or more holes extending at least partially through the layers and located between the pair of vias, the holes having a lower dielectric constant than the layers to increase a resonant frequency of the pair of via stubs beyond the frequency of the differential signal.

11. A circuit board comprising:
    a plurality of layers including a first layer, a second layer below the first layer, and a bottom layer;
    a pair of vias filled with a conductive material and extending through the layers, the pair of vias having a pair of via stubs;
    a first pair of conductive signal paths connected to the pair of vias within the first layer;
    a second pair of conductive signal paths connected to the pair of vias within the second layer, such that the pair of via stubs is defined between the second layer and the bottom layer, a differential signal having a frequency to be transmitted between the first pair of conductive signal paths and the second pair of conductive signal paths via the pair of vias,
    means for increasing a resonant frequency of the pair of via stubs beyond the frequency of the differential signal without backdrilling one or more of the pair of vias.

12. The circuit board of claim 11, wherein the means comprises one or more holes extending at least partially through the layers and located between the pair of vias, the holes having a lower dielectric constant than the layers to increase a resonant frequency of the pair of via stubs beyond the frequency of the differential signal.

13. A circuit board comprising:
    a plurality of layers including a first layer, a second layer below the first layer, and a bottom layer;
    a pair of vias filled with a conductive material and extending through the layers, the pair of vias having a pair of via stubs;
    a first pair of conductive signal paths connected to the pair of vias within the first layer;
    a second pair of conductive signal paths connected to the pair of vias within the second layer, such that the pair of via stubs is defined between the second layer and the bottom layer, a differential signal having a frequency to be transmitted between the first pair of conductive signal paths and the second pair of conductive signal paths via the pair of vias; and, one or more holes extending at least partially through the layers and located between the air of vias the holes having a lower dielectric constant than the layers to increase a resonant frequency of the pair of via stubs beyond the frequency of the differential signal, wherein the holes having the lower dielectric constant than the layers increase the resonant frequency of the pair of via stubs beyond the frequency of the differential signal without having to backdrill one or more of the pair of vias.

14. An electronic device comprising:

one or more electrical components; and, a circuit board on, to, or within which each electrical component is mounted, wherein the circuit board comprises:

a plurality of layers including a first layer, a second layer below the first layer, and a bottom layer;

a pair of vias filled with a conductive material and extending through the layers, the pair of vias having a pair of via stubs;

a first pair of conductive signal paths connected to the pair of vias within the first layer;

a second pair of conductive signal paths connected to the pair of vias within the second layer, such that the pair of via stubs is defined between the second layer and the bottom layer, a differential signal having a frequency to be transmitted between the first pair of conductive signal paths and the second pair of conductive signal paths via the pair of vias; and, one or more holes extending at least partially through the layers and located between the pair of vias the holes having a lower dielectric constant than the layers to increase a resonant frequency of the pair of via stubs beyond the frequency of the differential signal, wherein the holes having the lower dielectric constant than the layers increase the resonant frequency of the pair of via stubs beyond the frequency of the differential signal without having to backdrill one or more of the pair of vias.

* * * * *